United States Patent
Vazach et al.

(10) Patent No.: US 11,169,505 B2
(45) Date of Patent: Nov. 9, 2021

(54) CONSTANT INPUT RESISTANCE FOR REDUNDANT INPUT MODULES EMPLOYED IN HIGH AVAILABILITY SYSTEMS

(71) Applicant: Rockwell Automation Technologies, Inc., Mayfield Heights, OH (US)

(72) Inventors: Joseph G. Vazach, Mentor, OH (US); Edward C. Hopsecger, Mentor, OH (US); Rajesh Ramesh Shah, Singapore (SG)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 328 days.

(21) Appl. No.: 16/359,779

(22) Filed: Mar. 20, 2019

(65) Prior Publication Data

US 2020/0301399 A1    Sep. 24, 2020

(51) Int. Cl.
*G05B 19/4155* (2006.01)
*H03H 11/28* (2006.01)
*G01R 1/00* (2006.01)

(52) U.S. Cl.
CPC .......... *G05B 19/4155* (2013.01); *G05B 2219/31229* (2013.01); *H03H 11/28* (2013.01)

(58) Field of Classification Search
CPC .... H02J 1/00; H02M 1/00; G05F 1/00; G06N 3/00; G01R 1/00
See application file for complete search history.

(56) References Cited

U.S. PATENT DOCUMENTS

| | | | |
|---|---|---|---|
| 10,021,242 B1* | 7/2018 | Liang | G01R 19/165 |
| 2004/0207366 A1* | 10/2004 | Sung | H02J 7/35 |
| | | | 320/140 |
| 2005/0231242 A1* | 10/2005 | Vitale | H03K 17/14 |
| | | | 327/110 |
| 2009/0271558 A1 | 10/2009 | Wormmeester et al. | |
| 2012/0043378 A1* | 2/2012 | Vazach | H05K 7/1468 |
| | | | 235/375 |
| 2014/0312909 A1* | 10/2014 | Alley | G01R 31/3275 |
| | | | 324/415 |
| 2015/0276498 A1* | 10/2015 | Van Minnen | G01K 7/026 |
| | | | 374/181 |
| 2017/0219642 A1 | 8/2017 | Maier et al. | |
| 2018/0172740 A1 | 6/2018 | Marenski | |

FOREIGN PATENT DOCUMENTS

EP    3226010 A1    10/2017
JP    H10198473 A    7/1998

OTHER PUBLICATIONS

Extended European Search Report for Application No. 20163662.8 dated Jun. 22, 2020, 11 pages.

* cited by examiner

*Primary Examiner* — Jermele M Hollington
*Assistant Examiner* — Temilade S Rhodes-Vivour
(74) *Attorney, Agent, or Firm* — Fletcher Yoder, P.C.

(57) ABSTRACT

An input module may include a first resistor and a second resistor coupled in series with the first resistor. The input module may also include a switch that may electrically isolate the second resistor based on a voltage output by an additional input module electrically coupled to the input module via a terminal base.

20 Claims, 4 Drawing Sheets

CONSTANT INPUT RESISTANCE FOR REDUNDANT INPUT MODULES EMPLOYED IN HIGH AVAILABILITY SYSTEMS

BACKGROUND

The present disclosure relates generally to improving redundant monitoring of a sensor in a high availability system. More specifically, the present disclosure relates to maintaining functionality of certain electrical components during replacement of connected components according to a redundant configuration.

To operate certain electrical components (e.g., modems, communication devices) that may be used to control and monitor industrial automation equipment, these electrical components may be designed to operation under certain electrical conditions. For example, communication systems may expect to receive a certain voltage level as an input voltage, be coupled to a conductor having a certain line impedance, or the like. Industrial automation equipment often use redundant electrical components and devices to ensure that the respective equipment continues to operate in case that one of the electrical components or devices coupled to the equipment malfunctions or becomes unavailable. It is now recognized that providing improved systems and methods for ensuring that the redundant electrical components and devices maintain the expected electrical conditions for the communication systems when one of the redundant electrical components or devices becomes unavailable are desirable.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first embodiment, a system may include a control device that may control one or more operations of industrial automation equipment and a terminal base that may couple to the control device. The terminal base may include a first input module that may couple to the terminal base, such that the first input module may include a first resistor coupled in series with a second resistor. The system may also include a second input module that may couple to the terminal base, such that the second input module may include a third resistor coupled in series with a fourth resistor. The terminal base may electrically couple the first resistor and the second resistor in parallel with the third resistor and the fourth resistor when the first input module and the second input module are coupled to the terminal base. In addition, the first input module may electrically remove the second resistor from circuitry of the first input module in response to the second input module being disconnected from the terminal base.

In a second embodiment, an input module may include a first resistor and a second resistor coupled in series with the first resistor. The input module may also include a switch that may electrically isolate the second resistor based on a voltage output by an additional input module electrically coupled to the input module via a terminal base.

In a third embodiment, a method may include receiving a first voltage signal, at a first input module, via a terminal base that may couple the first input module to a second input module. The first voltage signal may include a ground voltage associated with the second input module, such that the ground voltage may cause a switch of the first input module to open. The method receiving a second voltage signal, at the first input module, via a voltage source in response to the second input module being disconnected from the terminal base, such that the second voltage signal may cause the switch to close. The switch may be coupled between a first resistor and a second resistor, such that the first resistor is electrically isolated from the first input module when the switch is closed.

DRAWINGS

These and other features, aspects, and advantages of the present disclosure will become better understood when the following detailed description is read with reference to the accompanying drawings in which like characters represent like parts throughout the drawings, wherein.

Figure 1:
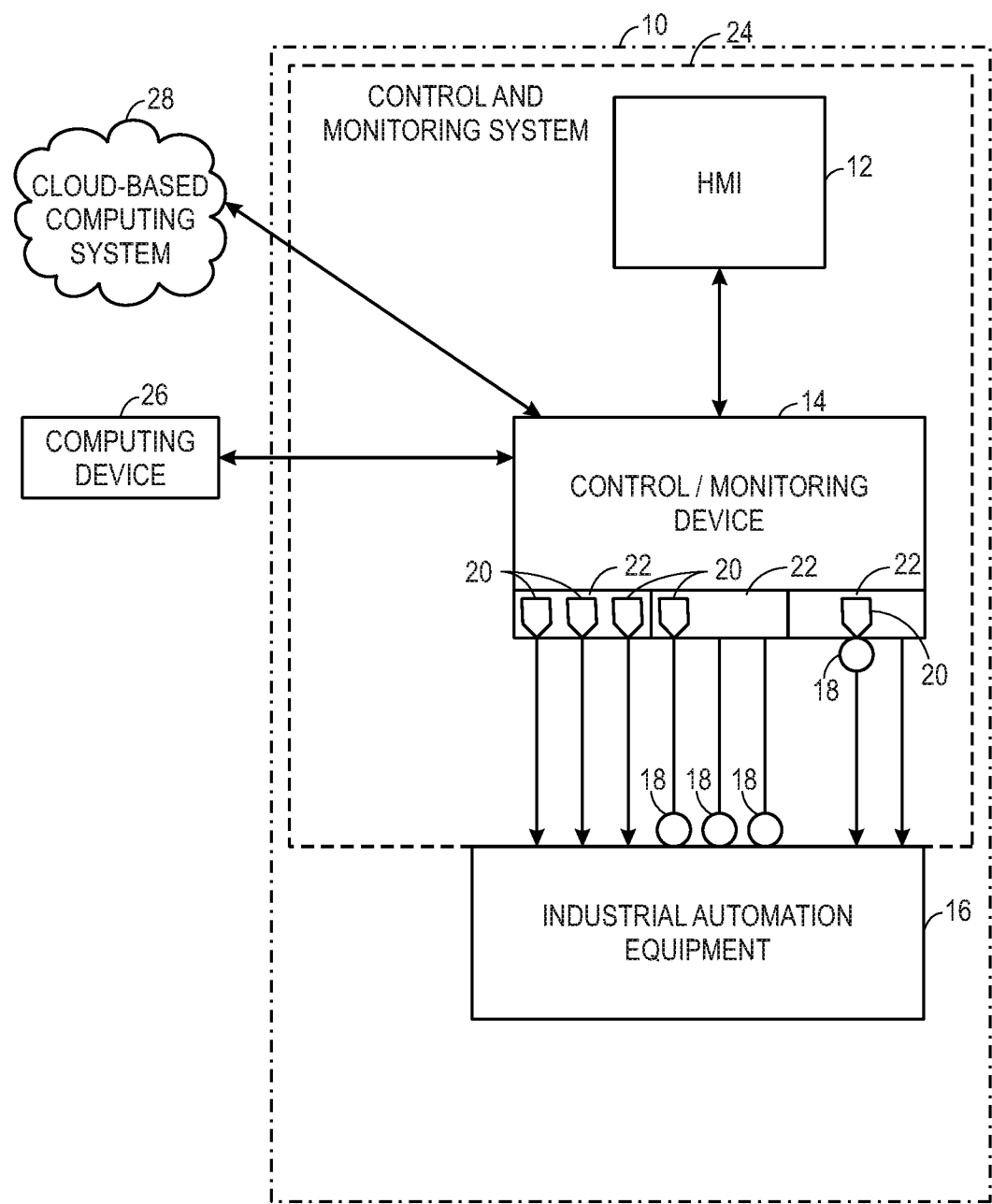
FIG. 1 is a block diagram of a control and monitoring system, in accordance with an embodiment of the present disclosure.
Figure 3:
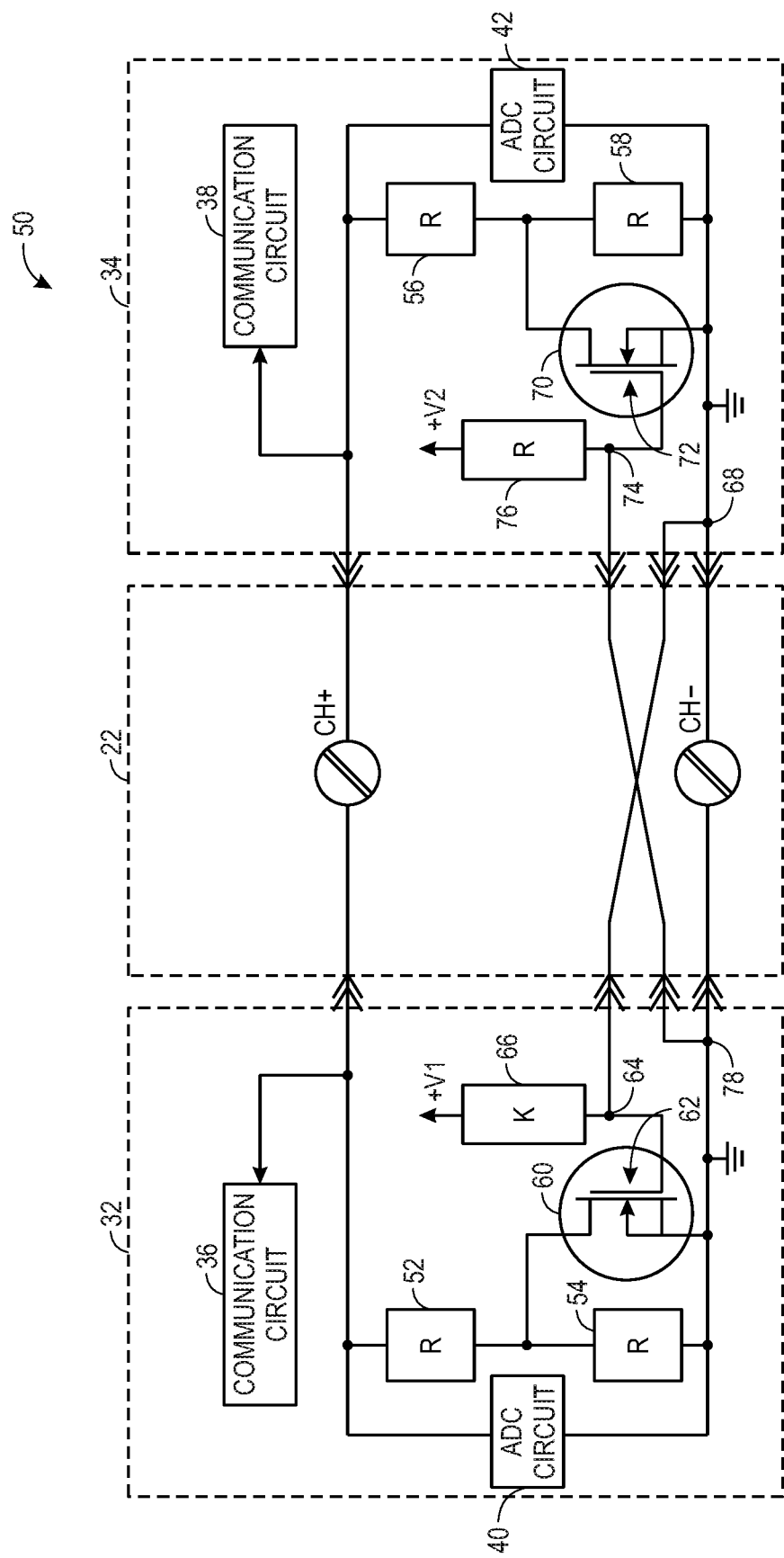
Figure 4:
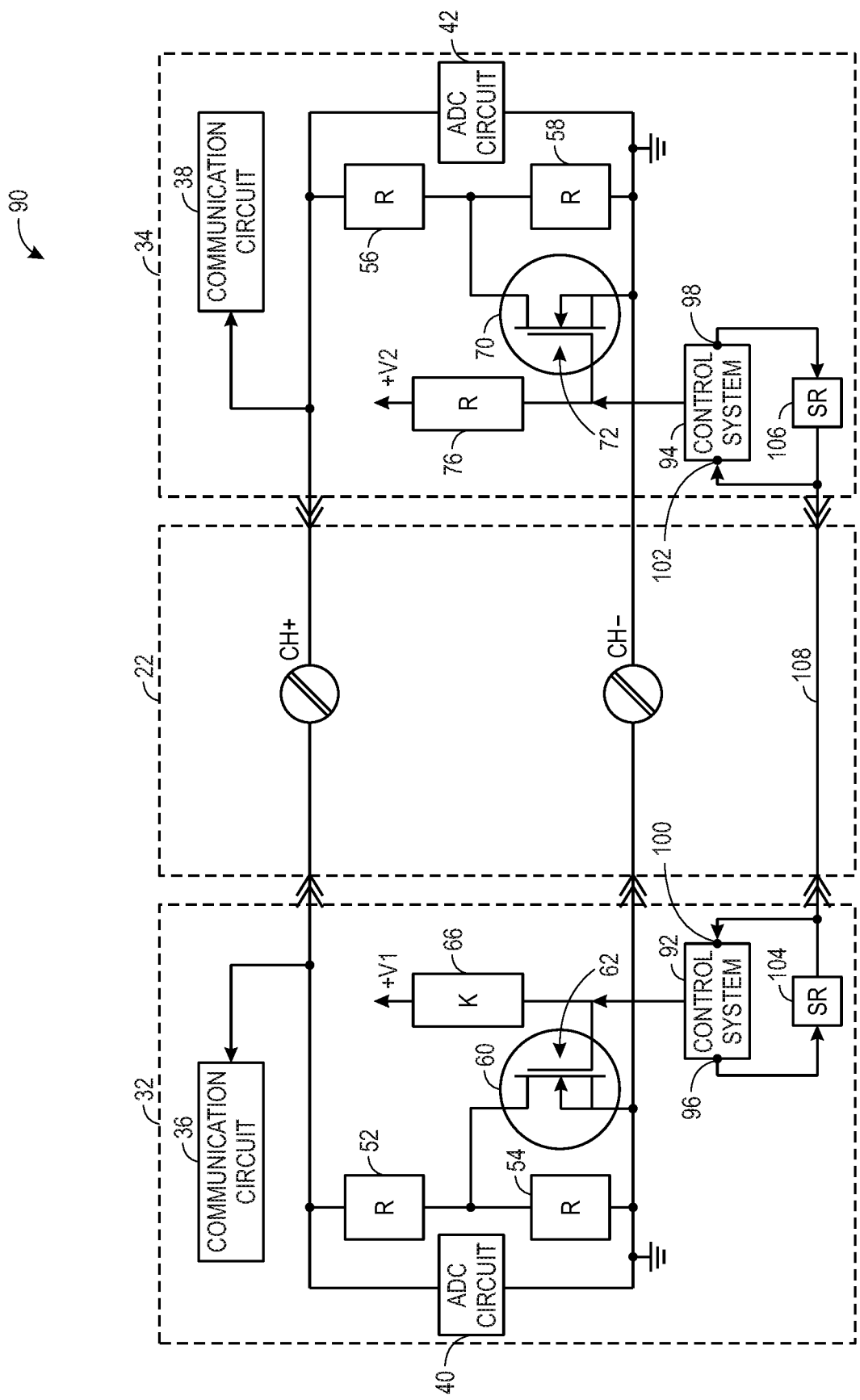

FIG. 3 is a second schematic diagram of a terminal base that may be part of the control and monitoring system of FIG. 1 with two input modules connected thereto, in accordance with an embodiment of the present disclosure; and FIG. 4 is a third schematic diagram of a terminal base that may be part of the control and monitoring system of FIG. 1 with two input modules connected thereto, in accordance with an embodiment of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Embodiments of the present disclosure are generally directed towards improving high availability systems. High availability systems generally refer to redundant monitoring and/or controlling of a sensor, a device, or the like. In certain embodiments, high availability systems may be available for use with industrial automation equipment to ensure that the equipment is operating continuously. High availability systems may include redundant monitoring of a sensor output received from one of a number of parallel-connected input modules. Each input module may measure an electrical property (e.g., a current, voltage, etc.) associated with a sensor (e.g., a current sensor, a temperature sensor, etc.), perform a control operation with respect to the connected industrial automation equipment, or the like.

In some embodiments, each input module may be communicatively coupled to communication circuit, which may transmit and receive data between the input module and other electronic devices (e.g., gateway, control system). To maintain operations of the communication circuit, the communication circuit may operate based on certain input electrical properties. For example, the communication circuit may use an input voltage within a certain range of voltages to power on and perform its respective operations. In addition, some communication circuits may expect a certain line impedance to be present on a connected input module to perform its respective operations. As such, each input module or a connected terminal base may include a resistor that corresponds to the expected line impedance for the communication circuit. In certain embodiments, the terminal base may include circuitry to receive a number of input modules to provide redundancy among the input modules. To ensure that the desired line impedance remains for the communication circuit, the terminal base circuitry and the input module circuitry may be designed in a certain manner to ensure that the expected line impedance is connected to the communication circuitry when both of the redundant input modules are connected and when one of the redundant input modules is removed or becomes unavailable. Additional details regarding various schemes for maintaining the line impedance when one of the input modules is removed are described below with reference to FIGS. 1-4.

By way of introduction, FIG. 1 is a block diagram of an example control and monitoring system 10 that may be used in accordance with an embodiment of the present disclosure. The control and monitoring system 10 may include a human machine interface (HMI) 12 and a control/monitoring device or automation controller 14 adapted to interface with devices (e.g., sensor 18) that may monitor various types of industrial automation equipment 16. It should be noted that the control and monitoring system 10 may be implemented by certain network strategies. For example, an industry standard network may be employed, such as Highway Addressable Remote Transducer (HART) protocol or DeviceNet, to enable data transfer. Such networks permit the exchange of data in accordance with a predefined protocol, and may provide power for operation of networked elements.

The industrial automation equipment 16 may take many forms and include devices for accomplishing many different and varied purposes. For example, the industrial automation equipment 16 may include machinery used to perform various operations in a compressor station, an oil refinery, a batch operation for making food items, a mechanized assembly line, and so forth. Accordingly, the industrial automation equipment 16 may comprise a variety of operational components, such as electric motors, valves, actuators, temperature elements, pressure sensors, or a myriad of machinery or devices used for manufacturing, processing, material handling, and other applications.

Additionally, the industrial automation equipment 16 may include various types of equipment that may be used to perform the various operations that may be part of an industrial application. For instance, the industrial automation equipment 16 may include electrical equipment, hydraulic equipment, compressed air equipment, steam equipment, mechanical tools, protective equipment, refrigeration equipment, power lines, hydraulic lines, steam lines, and the like. Some example types of equipment may include mixers, machine conveyors, tanks, skids, specialized original equipment manufacturer machines, and the like. In addition to the equipment described above, the industrial automation equipment 16 may also include controllers, input/output modules, motor control centers, motors, HMIs, operator interfaces, contactors, starters, additional sensors, actuators, drives, relays, protection devices, switchgear, compressors, sensor, actuator, firewall, network switches (e.g., Ethernet switches, modular-managed, fixed-managed, service-router, industrial, unmanaged, etc.) and the like.

In certain embodiments, one or more properties of the industrial automation equipment 16 may be monitored by certain equipment for regulating control variables used to operate the industrial automation equipment 16. For example, a sensor 18 may monitor various properties of the industrial automation equipment 16.

In some cases, the industrial automation equipment 16 may be associated with devices used by other equipment. For instance, scanners, gauges, valves, flow meters, and the like may be disposed on industrial automation equipment 16. Here, the industrial automation equipment 16 may receive data from the associated devices and use the data to perform their respective operations more efficiently. For example, a controller (e.g., the control/monitoring device 14) of a motor drive may receive data regarding a temperature of a connected motor and may adjust operations of the motor drive based on the data.

The sensor 18 may be a device adapted to provide information regarding process conditions. The sensor 18 may be utilized to monitor the industrial automation equipment 16. In particular, the sensor 18 may be utilized within process loops that are monitored by the control/monitoring device 14 and/or the HMI 12. Such a process loop may be activated based on process inputs (e.g., input from the sensor 18) or direct operator input received through the HMI 12. As illustrated, the sensor 18 is in communication with the control/monitoring device 14. Further, the sensor 18 may be assigned a particular address in the control/monitoring device 14 and receive power from the control/monitoring device 14 or attached modules. There may be any number of the sensors 18 electrically coupled to the control/monitoring device 14 monitoring the industrial automation equipment 16.

The input modules 20 may be installed or removed from the control and monitoring system 10 via expansion slots, bays, a terminal base 22, or other suitable mechanisms. The terminal base 22 may electrically couple to any number of various components, such as the input modules 20, and route signals between the various components and the control/monitoring device 14. In certain embodiments, the input modules 20 may be included to add functionality to the control/monitoring device 14, or to accommodate additional process features. For instance, the input modules 20 may communicate with the sensors 18 added to monitor the industrial automation equipment 16. It should be noted that the input modules 20 may communicate directly to sensors 18 through hardwired connections or may communicate through wired or wireless sensor networks, such as HART or IOLink. In some embodiments, the input modules 20 may be in the form of input/output modules.

Generally, the input modules 20 may serve as an electrical interface to the control/monitoring device 14 and may be located proximate or remote from the control/monitoring device 14, including remote network interfaces to associated systems. In such embodiments, data may be communicated with the remote input modules 20 over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

In the illustrated embodiment, several of the input modules 20 may transfer signals between the control/monitoring device 14 and the industrial automation equipment 16. As illustrated, the sensor 18 may communicate with the control/monitoring device 14 via the several input modules 20 electrically coupled to the control/monitoring device 14. The several input modules 20 may be utilized redundantly, such that if one of the several input modules 20 becomes unavailable, one of the remaining input modules 20 may operate in its place. In this manner, the control and monitoring system 10 may continue operating without interruption despite an input module 20 becoming unavailable.

In certain embodiments, the control and monitoring system 10 (e.g., the HMI 12, the control/monitoring device 14, the sensors 18, the input modules 20) and the industrial automation equipment 16 may make up an industrial application 24. The industrial application 24 may involve any type of industrial process or system used to manufacture, produce, process, or package various types of items. For example, the industrial applications 24 may include industries such as material handling, packaging industries, manufacturing, processing, batch processing, and the like. In certain embodiments, the control/monitoring device 14 may be communicatively coupled to a computing device 26 and a cloud-based computing system 28. In this network, input and output signals generated from the control/monitoring device 14 may be communicated between the computing device 26 and the cloud-based computing system 28.

Figure 2:
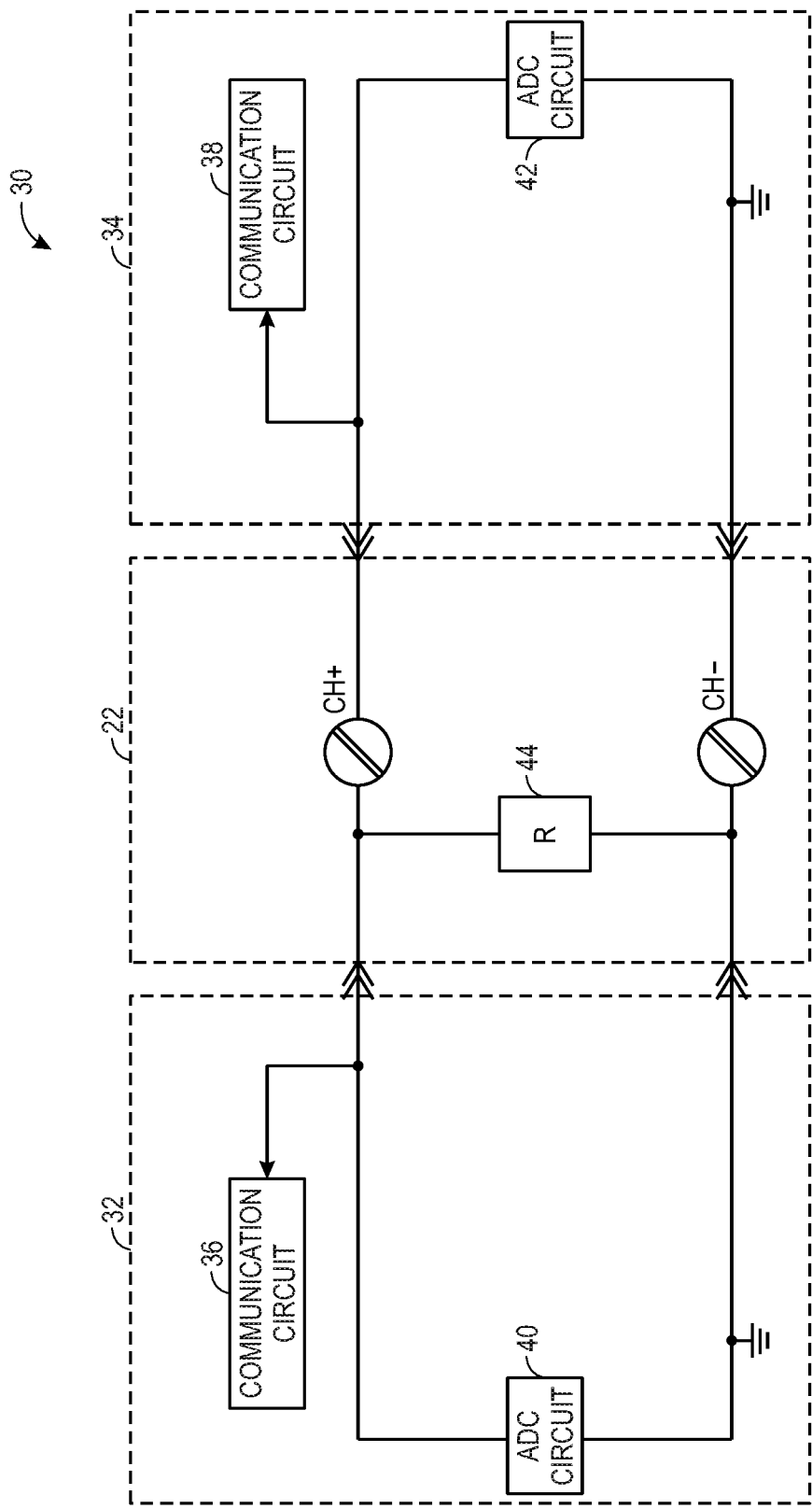
FIG. 2 is a schematic diagram of a terminal base that may be part of the control and monitoring system of FIG. 1 with two input modules connected thereto, in accordance with an embodiment of the present disclosure.

With the foregoing in mind, FIG. 2 is an example schematic diagram that allows redundant input modules 20 coupled to the terminal base 22 (e.g., that may be part of the control and monitoring system 10) to maintain a certain amount of line impedance for communication circuitry connected to each input module 20. For instance, a redundant input module system 30 depicted in FIG. 2 provides an example manner in which a certain amount of line impedance may be maintained for communication circuitry coupled to each input module when one of the input modules is removed.

Referring to FIG. 2, the redundant input module system 30 may include the terminal base 22 connected to input module 32 and input module 34. The operations and properties of the input module 32 and 34 may correspond to the input module 20 described above. Each respective input module 32 and 34 may be able to communicatively couple to communication circuit 36 and 38, respectively. Although the redundant input module system 30 illustrates the input modules 32 and 34 being communicatively coupled to two different communication circuits 36 and 38, it should be noted that, in some embodiments, the input modules 32 and 34 may be coupled to any suitable number of communication circuits, including one.

In some embodiments, each input module 32 and 34 may include additional circuit components that enable the respective module to perform its respective operations. By way of example, the input modules 32 and 34 may include analog-to-digital converter (ADC) circuits 40 and 42 that may convert analog voltages received by the input modules 32 and 34 into digital voltage interpretable by internal circuitry within the input modules 32 and 34. In some embodiments, these additional circuit components may expect certain electrical properties (e.g., impedance) to be present to perform their respective operations.

As mentioned above, the communication circuit 36 and 38 may expect a certain amount of line impedance to be present on the conductor or terminal connecting the communication circuit 36 and 38 to the input modules 32 and 34, respectively. For example, communication circuits 36 and 38 implementing HART functionality may expect a certain amount of resistance (e.g., 250 ohms) to be coupled thereto. To ensure that the same amount of line impedance is available for each communication circuit 36 and 38 when one of the input modules 32 or 34 is removed or becomes unavailable, a resistor 44 is coupled across two terminals or nodes of the terminal base 22. The resistance of the resistor 44 may correspond to the expected resistance or line impedance associated with the communication circuits 36 and 38. In this way, when either input module 32 or 34 become unavailable, the same line impedance remains connected to the communication circuits 36 or 38 due to the resistor 44.

Although the redundant input module system 30 of FIG. 2 may maintain a certain amount of line impedance when either input module 32 of 34 becomes unavailable, the design of the redundant input module system 30 has some shortcomings. For example, terminal bases 22 are not easily repairable after they are placed in service. As such, if the resistor 44 short circuits or becomes unavailable or loses its resistance properties (e.g., degrades), the field wiring to each input module 32 and 34 would have to be disconnected to replace the terminal base 22, thereby causing the connected industrial automation equipment 16 to be powered down or be left unmonitored. In addition, by relying on the resistor 44 to provide the line impedance for both communication circuits 36 and 38, the resistor 44 becomes a single component that potentially disables the operations of the communication circuits 36 and 38. That is, the resistor 44 does not include any redundancy to ensure that the operations of the redundant input module system 30 continue in case the resistor 44 becomes unavailable.

Keeping this in mind, FIG. 3 includes a redundant input module system 50 that enables the communication circuits 36 and 38 to continue to operate with the expected line impedance when either input module 32 or 34 becomes unavailable, while providing a redundancy for the line impedance in each input module 32 and 34. As such, the terminal base 22 may avoid including components (e.g., resistors) that may degrade or need replacement.

Referring now to FIG. 3, the redundant input module system 50 includes the input modules 32 and 34, the communication circuits 36 and 38, and the ADC circuits 40 and 42 described above. As shown in FIG. 3, the redundant input module system 50 may include the terminal base 22 without a resistor contained therein. Instead, each of the input modules 32 and 34 include resistors 52, 54, 56, and 58 that may be used to provide the expected line impedance for the communication circuits 36 and 38.

By way of operation, the input module 32 may employ a switch 60 to control the line impedance provided to the communication circuit 36 based on the connection arrangement of the resistors 52 and 54. The switch 60 may be any suitable type of field-effect transistor (FET) device that may operate (e.g., open/close) based on a gate signal provided to the switch 60. For example, the switch 60 may be a metal-oxide-semiconductor field-effect transistor (MOSFET) or other suitable type of switch. It should be noted that although N-type switches are provided in the figures, in some embodiments, P-type switches may be used instead of the N-type switches.

As shown in FIG. 3, the resistor 52 and the resistor 54 are electrically coupled together in series. By way of example, if each resistor 52 and 54 is 250 ohms, the line impedance provided to the communication circuit 36 is 500 ohms when the switch 60 is off (e.g., open). The switch 60 may be open when the input module 34 is coupled to the terminal base 22. That is, a gate 62 of the switch 60 may be coupled to a node 64, which may be coupled to a pull up resistor 66 and a grounding node 68 of the input module 34. Since the node 64 is coupled to ground via the grounding node 68 of the input module 34, the node 64 may have 0 volts present on it. As such, the voltage provided to the gate 62 of the switch 60 does not exceed a threshold voltage to turn the switch on (e.g., close).

With this in mind, the input module 34 includes a switch 70, a gate 72 of the switch 70, a node 74, and a pull up resistor 76 that corresponds to the switch 60, the gate 62 of the switch 60, the node 64, and the pull up resistor 66 described above with respect to the input module 32. As such, when the input modules 32 and 34 are connected to the terminal base 22, the switch 70 may be open because the gate 72 of the switch 70 may be coupled to the node 74, which may be coupled to a grounding node 78 of the input module 32. In addition, to the node 74 being coupled to the grounding node 78 via the terminal base 22, the node 74 may also be coupled to the pull up resistor 76, which may correspond to the pull up resistor 66 of the input module 32. However, since the nodes 64 and 74 are effectively coupled to ground via the terminal base 22, the switches 60 and 70 remain off (e.g., open). As a result, the resistors 52 and 54 create a 500 ohm resistance on the conductor coupled to the communication circuit 36, while the resistors 56 and 58 create a 500 ohm resistance on the conductor coupled to the communication circuit 38. These two 500 ohm resistances are coupled to each other in parallel via the terminal base 22, thereby effectively providing a 250 ohm resistance (e.g., expected line impedance) on the conductors coupled both communication circuits 36 and 38.

To ensure that the expected line impedance is provided to the communication circuit 36 or 38 when one of the input modules 32 or 34 is removed or becomes unavailable, one of the switches 60 or 70 may activate (e.g., turn on, close) to change the effective line impedance provided to the respective communication circuit 36 or 38. For instance, if the input module 34 is no longer connected to the terminal base 22, the node 64 of the input module 32 may no longer be coupled to the grounding node 68 of the input module 34. Instead, the gate 62 of the switch 60 may receive a positive voltage that exceeds the threshold voltage of the switch 60 via the pull up resistor 66. It should be noted that each of the pull up resistors 66 and 76 may be coupled to voltage sources V1 and V2, respectively. The voltage sources V1 and V2 may output a voltage that may be available to the respective input modules 32 and 34.

With this in mind, the voltage provided to the gate 62 of the switch 60 via the pull up resistor 66 and the voltage source V1 may cause the switch 60 to close. The resistor 54 may then be shorted out of the circuit for the input module 32. In this way, the effective resistance on the conductor coupled to the communication circuit 36 is 250 ohms.

It should be understood that although the foregoing discussion of the input modules 32 and 34 are described using particular resistance values, the recited resistance values are provided as examples to help illustrate the functionality of the embodiments presented herein. Indeed, any suitable resistor having a variety of resistance values may be used in accordance with the embodiments herein based on the expected line impedance that corresponds to the communication circuits 36 and 38.

Based on the operation of the redundant input module system 50 described above, the input modules 32 and 34 may automatically adjust their field side impedance as either input module 32 or 34 is removed or inserted. Advantageously, the redundant input module system 50 may not involve additional field wiring of the terminal base 22 upon insertion or removal of the respective input module 32 or 34. In some embodiments, parallel switches 60 or 70 may be added to the input modules 32 or 34 to provide redundant switches that control the effective line impedance of the input modules 32 or 34.

Keeping the foregoing in mind, FIG. 4 illustrates another embodiment of a redundant input module system 90 that enables the communication circuits 36 and 38 to continue to operate with the expected line impedance when either input module 32 or 34 becomes unavailable, while providing a redundancy for the line impedance in each input module 32 and 34.

As shown in FIG. 4, the redundant input module system 90 may include similar components as described above with respect to the redundant input module system 50 of FIG. 3. However, instead of the switches 60 and 70 being controlled based on the connection to ground via the terminal base 22, the redundant input module system 90 may include control systems 92 and 94 for the input modules 32 and 34, respectively, to facilitate the operations of the switches 60 and 70, respectively.

Before proceeding, it should be mentioned that the control systems 92 and 94 may include any suitable control system implemented via any suitable computing device. As such, the control system 92 and 94 may include a communication component, a processor, a memory, a storage, input/output (I/O) ports, and the like. The communication component may be a wireless or wired communication component that may facilitate communication between other communication capable devices. The processor may be any type of computer processor or microprocessor capable of executing computer-executable code. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may also be used to store the data, analysis of the data, the software applications, and the like. The memory and the storage may represent non-transitory computer-readable media (e.g., any suitable form of memory or storage) that may store the processor-executable code used by the processor to perform various techniques described herein. It should be noted that non-transitory merely indicates that the media is tangible and not a signal.

In some embodiments, the control systems 92 and 94 may include general purpose input/output (I/O) ports that may transmit data, receive data, output voltages, receive voltages, and the like. For example, the control systems 92 and 94 may output voltages via I/O ports 96 and 98, respectively. In the same manner, the control systems 92 and 94 may receive sensed voltages via ports 100 and 102, respectively.

In addition to outputting and receiving voltages, the control systems 92 and 94 may output a gate signal to the switches 60 and 70 to control their respective operations. For example, the control system 92 may control the operation of the switch 60 based on whether it detects the presence of the input module 34 being connected to the terminal base 22. It should be noted that, in some embodiments, the pull up resistors 66 and 76 and the voltages sources V1 and V2 may not be included in the redundant input module system 90. Instead, the control systems 92 and 94 may output gate signals to control the state of the switches 60 and 70 without the pull up resistors 66 and 76.

To detect the presence of the input module 34 being connected to the terminal base 22, the control systems 92 and 94 may coordinate their operations in a particular manner. By way of example, the control system 92 may output a logic high voltage via the I/O port 96, which may be coupled to a sense resistor 104 within the input module 32. At the same time, the control system 94 may output a logic low voltage via the I/O port 98, which may be coupled to a sense resistor 106 of the input module 34. The sense resistors 104 and 106 may provide some resistance across a checkpoint conductor 108 that couples the input modules 32 and 34 to each other via the terminal base 22.

When the input modules 32 and 34 and coupled to each other via the terminal base 22 and the checkpoint conductor 108, the control system 92 may output the logic high voltage to the sense resistor 104 and the control system 94 may output a logic low voltage to the sense resistor 106. As a result, the voltage present on the checkpoint conductor 108 may be some value between the logic high voltage and the logic low voltage. The control systems 92 and 94 may monitor the voltage of the checkpoint conductor 108 via the ports 100 and 102, respectively.

In response to the input module 34 being removed from the terminal base 22, the voltage detected by the control system 92 may swing towards the logic high voltage due to the loss of the logic low voltage on the checkpoint conductor 108. Upon detecting this voltage swing, the control system 92 may determine that the input module 34 has been removed and may output a gate signal to the gate 62 of the switch 60. The gate signal may cause the switch 60 to close, thereby shorting out the resistor 54 and providing a line impedance to the communication circuit 36 that corresponds to the resistance of the resistor 52. Like the redundant input module system 50 of FIG. 3, when both input modules 32 and 34 of the redundant input module system 90 are coupled to the terminal base 22, the effective line impedance available for each communication circuit 36 and 38 corresponds to the series resistance of resistors 52 and 54 in parallel connection with the series resistance of resistors 56 and 58, as described above with respect to FIG. 3.

In addition to maintaining the line impedance for the respective communication circuits 36 and 38, the redundant input module system 90 may also enable the input modules 32 and 34 to communicate with each other via the checkpoint conductor 108. That is, the control systems 92 and 94 may assist each other in obtaining the same analog measured value via the ADC circuits 40 and 42 when the output signal of one or both of the input modules 32 and 34 is varying. For instance, a checkpoint signal may be used to synchronize the analog to digital (ADC) measurements acquired by each input module 32 and 34. By way of example, the control system 92 may output a pulsed signal via the port 96 at the start of its ADC measurement. In response to the pulsed signal transmitted across the checkpoint conductor 108, the control system 94 may sense this signal and send commands to the ADC circuit 42 to start its ADC measurement. As a result, both input modules 32 and 34 may be synchronized to perform its measurements at substantially the same time. In addition, the control system 92 and 94 may create a half-duplex communication channel between the input modules 32 and 34 using the checkpoint conductor 108 to transfer additional information or data between each input module 32 and 34.

While only certain features of the presently disclosed embodiments have been illustrated and described herein, many modifications and changes will occur to those skilled in the art. It is, therefore, to be understood that the appended claims are intended to cover all such modifications and changes as fall within the true spirit of the embodiments disclosed herein.

The invention claimed is:

1. A system, comprising:
a control device configured to control one or more operations of industrial automation equipment;
a terminal base configured to couple to the control device, wherein the terminal base;
a first input module configured to couple to the terminal base, wherein the first input module comprises a first resistor coupled in series with a second resistor;
a second input module configured to couple to the terminal base, wherein the second input module comprises a third resistor coupled in series with a fourth resistor;
wherein the terminal base is configured to electrically couple the first resistor and the second resistor in parallel with the third resistor and the fourth resistor when the first input module and the second input module are coupled to the terminal base; and
wherein the first input module is configured to receive a ground signal associated with the second input module via the terminal base while the second input module and the first input module is coupled to the terminal base;
wherein the first input module is configured to receive a voltage signal associated with the first input module in response to the second input module being disconnected from the terminal base, wherein the voltage signal is configured to cause the second resistor to be electrically removed from circuitry of the first input module.

2. The system of claim 1, wherein the first input module comprises a switch configured to electrically remove the second resistor from the circuitry of the first input module.

3. The system of claim 2, wherein the switch is configured to close in response to the second input module being disconnected from the terminal base.

4. The system of claim 2, wherein the switch is configured to open or close based on a voltage output by the second input module.

5. The system of claim 2, wherein the switch is configured to:
close in response to receiving the voltage signal; and
open in response to receiving the ground signal.

6. The system of claim 2, wherein the first input module comprises a control system configured to detect a voltage of a conductor coupled between the first input module and the second input module.

7. The system of claim 6, wherein the control system is configured to output an additional voltage on the conductor.

8. The system of claim 6, wherein the control system is configured to control an operation of the switch based on the voltage on the conductor.

9. The system of claim 6, wherein the first input module comprises a fifth resistor coupled to the conductor.

10. An input module, comprising:
a first resistor;
a second resistor coupled in series with the first resistor; and
a switch configured to electrically isolate the second resistor based on a voltage output by an additional input module configured to electrically couple to the input module via a terminal base, wherein the switch is configured to open in response to receiving a ground signal as the voltage output via a terminal base configured to couple the input module to the additional input module, and wherein the switch is configured to close in response to receiving a voltage signal via a voltage source of the input module after the additional input module is removed from the terminal base.

11. The input module of claim 10, wherein the voltage output is received at a gate of the switch, wherein the switch is configured to operate based on the voltage output.

12. The input module of claim 10, comprising a third resistor configured to couple to a gate of the switch and the voltage source.

13. The input module of claim 12, wherein the gate of the switch is configured to receive the voltage signal via the voltage source when the additional input module is disconnected from the terminal base.

14. The input module of claim 12, wherein the gate of the switch is configured to receive the ground signal via the additional input module when the additional input module is coupled to the terminal base.

15. The input module of claim 10, comprising a control system configured to control an operation of the switch based on a voltage associated with a conductor configured to couple the input module to the additional input module.

16. A method, comprising:
receiving a first voltage signal, at a first input module, via a terminal base configured to couple the first input module to a second input module, wherein the first voltage signal comprises a ground voltage associated with the second input module, wherein the ground voltage is configured to cause a switch of the first input module to open; and
receiving a second voltage signal, at the first input module, via a voltage source in response to the second input module being disconnected from the terminal base, wherein the second voltage signal is configured to cause the switch to close, wherein the switch is coupled between a first resistor and a second resistor, and wherein the first resistor is electrically isolated from the first input module when the switch is closed.

17. The method of claim 16, wherein the second voltage signal is provided via a control system configured to monitor a voltage of a conductor electrically coupled to the first input module and the second input module.

18. The method of claim 17, wherein the control system is configured to provide the second voltage signal to the first input module in response to detecting a change in the voltage.

19. The method of claim 17, wherein the control system is configured to communicate data between the first input module and the second input module via the conductor.

20. The method of claim 16, wherein the first resistor is coupled in series with the second resistor.

* * * * *